United States Patent [19]

Ljungberg

[11] Patent Number: 5,702,808
[45] Date of Patent: Dec. 30, 1997

[54] AL₂O₃-COATED CUTTING TOOL PREFERABLY FOR NEAR NET SHAPE MACHINING

[75] Inventor: Björn Ljungberg, Enskede, Sweden

[73] Assignee: Sandvik AB, Sandviken, Sweden

[21] Appl. No.: 557,580

[22] Filed: Nov. 14, 1995

[30] Foreign Application Priority Data

Nov. 15, 1994 [SE] Sweden ............... 9403932

[51] Int. Cl.⁶ .................................. B23P 15/28
[52] U.S. Cl. ............... 428/216; 428/156; 428/212; 428/469; 428/472; 428/698; 428/701; 428/702; 51/307; 51/309; 407/119
[58] Field of Search ............... 428/156, 472, 428/698, 701, 702, 469, 212, 216; 51/295, 307, 309; 407/119

[56] References Cited

U.S. PATENT DOCUMENTS

| | | |
|---|---|---|
| Re. 29,420 | 9/1977 | Lindström et al. |
| 3,736,107 | 5/1973 | Hale. |
| 3,837,896 | 9/1974 | Lindström et al. |
| 3,977,061 | 8/1976 | Lindstrom et al. ............ 428/212 |
| 4,018,631 | 4/1977 | Hale. |
| 4,399,168 | 8/1983 | Kullander et al. |
| 4,463,033 | 7/1984 | Kikuchi et al. |
| 4,490,191 | 12/1984 | Hale. |
| 4,619,866 | 10/1986 | Smith et al. |
| 4,966,501 | 10/1990 | Nomura. |
| 5,071,696 | 12/1991 | Chatfield et al. |
| 5,137,774 | 8/1992 | Ruppi. |
| 5,487,625 | 1/1996 | Ljungberg et al. ............ 407/117 |

*Primary Examiner*—Archene Turner
*Attorney, Agent, or Firm*—Burns, Doane, Swecker & Mathis, L.L.P.

[57] ABSTRACT

A body is disclosed with a coating comprising one or more refractory layers of which one layer is an outermost smooth, shiny 110-textured α-Al₂O₃ layer. Said Al₂O₃ layer has a surface appearance almost like a polished Al₂O₃ layer. Coated tools show improved tool lives compared to prior art tools when used for machining steel or cast iron material preferably for near net shape machining.

10 Claims, 1 Drawing Sheet

AL₂O₃-COATED CUTTING TOOL PREFERABLY FOR NEAR NET SHAPE MACHINING

BACKGROUND OF THE INVENTION

The present invention relates to an $Al_2O_3$ coated cutting tool for chipforming machining and in particular for near net shape machining.

Cemented carbide cutting tools coated with various types of $Al_2O_3$ layers, e.g., pure $\kappa$-$Al_2O_3$, mixtures of $\kappa$- and $\alpha$-$Al_2O_3$ and very coarse-grained $\alpha$-$Al_2O_3$ have been commercially available for many years. $Al_2O_3$ crystallizes in several different phases: $\alpha$, $\kappa$, $\gamma$, $\beta$, $\theta$, etc. The two most frequently occurring phases formed by the CVD of wear resistant $Al_2O_3$ layers are the thermodynamically stable hexagonal $\alpha$-phase and the metastable $\kappa$-phase. Generally, the $\kappa$-phase is fine-grained with a grain size in the range 0.5–2.0 μm, often exhibiting a columnar coating morphology. Furthermore, $\kappa$-$Al_2O_3$ layers are free from crystallographic defects and free from micropores or voids.

The $\alpha$-$Al_2O_3$ grains are usually coarser with a grain size of 1–6 μm depending upon the deposition conditions. Porosity and crystallographic defects are in this case more common.

Often, both $\alpha$- and $\kappa$-phase are present in an $Al_2O_3$ CVD layer deposited onto a cutting tool. In commercial cutting tools, $Al_2O_3$ is always applied on TiC coated carbide or ceramic substrates (se, e.g., U.S. Pat. No. 3,837,896, now Reissue U.S. Pat. No. 29,420) and therefore the interfacial chemical reactions between the TiC surface and the $Al_2O_3$ layer are of particular importance. In this context, the TiC layer should also be understood to include layers having the formula $TiC_xN_yO_z$ in which the carbon in TiC is completely or partly substituted by oxygen and/or nitrogen.

U.S. Reissue Pat. No. 29,420 and U.S. Pat. Nos. 4,399,168, 4,018,631, 4,490,191 and 4,463,033 disclose oxide coated bodies and how different pretreatments, e.g., of TiC-coated cemented carbide, enhance the adherence of the subsequently deposited oxide layer. $Al_2O_3$ coated bodies are further disclosed in U.S. Pat. Nos. 3,736,107, 5,071,696 and 5,137,774 wherein the $Al_2O_3$ layers comprise $\alpha$, $\kappa$ and $\alpha$+$\kappa$ combinations, respectively.

U.S. Pat. No. 4,619,866 describes a method for producing fast growing $Al_2O_3$ layers by utilizing a hydrolysis reaction of a metal halide under the influence of a dopant selected from the groups consisting of sulphur, selenium, tellurium, phosphorous arsenic, antimony, bismuth and mixtures thereof. Under these process conditions, essentially two phases of $Al_2O_3$, the $\alpha$- and the $\kappa$-phases, are produced. The resulting layer consists of a mixture of the smaller $\kappa$-grains and the larger $\alpha$-grains. The process yields layers with an even layer thickness distribution around the coated body.

In U.S. Ser. Nos. 08/159,217 (our reference: 024000-993) incorporated by reference herein, 08/348,084 (our reference: 024444-092) incorporated by reference herein and 08/366,107 (our reference: 024444-093) incorporated by reference herein, methods are disclosed how to deposit fine-grained textured $\alpha$-$Al_2O_3$ layers. In U.S. Ser. No. 08/348,084, the $Al_2O_3$ layer is deposited under influence of a sulphur-fluorine dopant. The resulting $Al_2O_3$ layer generally has platelet-shaped grains with a strong 110-texture. The $Al_2O_3$ layer is almost free from cooling cracks.

Nowadays, many components in industry are forged or pressed close to their final dimensions. Thus, less machining is needed to finalize the components. Such so-called "near net shape machining" requires tools (e.g., indexable inserts) with smooth clean cutting edges, that is, a cutting edge free from smearings of work piece material, free from flaking of layers and with a very little developed flank and crater wear in order to ensure a good machined surface finish on the final component.

Using cutting edges with very little developed wear makes it difficult for the machine operator by naked eye inspection to differentiate between such an edge and an unused cutting edge ("edge identification"). This is particularly difficult if the top layer is $Al_2O_3$ which color is dark grey or black. By mistake, the use of a used tool edge, e.g., during an unmanned night shift run, may cause component rejection and unwanted production stops. Edge identification can more easily be done if the insert has a top layer of $TiC_xN_yO_z$ or in particular, if the top layer is a goldish TiN layer. Generally, with thin top layers of, e.g., TiN, on $Al_2O_3$, the smoothness and shininess of the insert surface and hence the cutting performance is influenced by the morphology of the $Al_2O_3$ layer.

Although the $\alpha$-$Al_2O_3$ layers disclosed in U.S. Ser. Nos. 08/159,217, 08/348,084 and 08/366,107 mentioned above exhibit excellent wear and flaking properties, the coating surface topography is not always optimal for near net shape machining unless these coatings are mechanically smoothened, e.g., by brushing, polishing or blasting methods. For example, in U.S. Pat. No. 4,966,501 a method for obtaining a smooth cutting edge by diamond polishing is disclosed. However, post treatment of coated tools increase production costs.

By smooth coatings (not mechanically treated) in this context is meant coatings with grains facets essentially parallel or almost parallel to the coating surface and with only small ditches between the grains.

Such surfaces generally appear very shiny and are less prone to have work piece material adhere onto the edge. Coating surface topography is influenced by grain size, grain shape and grain orientation which in turn is determined by process conditions used during the nucleation and growth steps.

A smooth coating surface of a thick, >4 μm, $Al_2O_3$ layer structure can, to a certain extent, be obtained by interrupting the $Al_2O_3$ layer with a number of very thin layers (0.1–1.0 μm) of $TiC_xN_yO_z$. However, such multilayer CVD processes are very complicated. There is always a great risk for flaking of the individual layers. With this technique, it is not possible to grow an outermost layer of $\alpha$-$Al_2O_3$ thicker than about 2 μm if the smoothness of the layer has to be maintained.

OBJECTS AND SUMMARY OF THE INVENTION

It is an object of this invention to avoid or alleviate the problems of the prior art.

It is further an object of this invention to provide a smooth and shiny $Al_2O_3$ layer suitable for near net shape machining.

It is still further an object of this invention to find process conditions in order to deposit $\alpha$-$Al_2O_3$ layers with smooth, shiny surface and thereby avoid costly post treatment production processes of the coated tools.

In one aspect of the invention there is provided a body with a <20 μm thick coating including an outermost layer of $\alpha$-$Al_2O_3$ with a thickness of 2.5–12 μm 3–8 μm, wherein said $Al_2O_3$ layer as coated, has a smooth, shiny appearance like it has been polished.

3

In another aspect of the invention there is provided a method of coating a body with an α-Al$_2$O$_3$ layer by CVD by which the body is brought in contact with a hydrogen carrier gas containing one or more halides of aluminum and a hydrolyzing and/or oxidizing agent at a high temperature wherein the oxidation potential of the CVD reactor atmosphere prior to the nucleation of Al$_2$O$_3$ is kept at a low level using a total concentration level of H$_2$O or other oxidizing species such as CO$_2$, O$_2$, etc., below 5 ppm, the nucleation of Al$_2$O$_3$ is started by a controlled sequencing of the reactant gases in the following order: CO$_2$, CO and AlCl$_3$, that the temperature is about 1000° C. during the nucleation and that during the growth of the Al$_2$O$_3$ layer, two different dopants are used providing different growth conditions.

DETAILED DESCRIPTION OF THE PREFERRED EMBODIMENTS OF THE INVENTION

Figure 1:
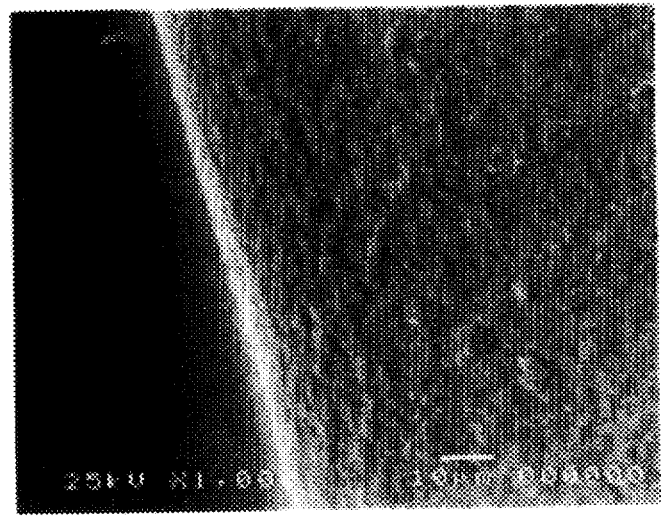
FIG. 1 is a SEM photo in 1000× of the smooth α-Al$_2$O$_3$ layer surface along the edge line of a cutting insert coated according to the presently claimed invention.
Figure 2:
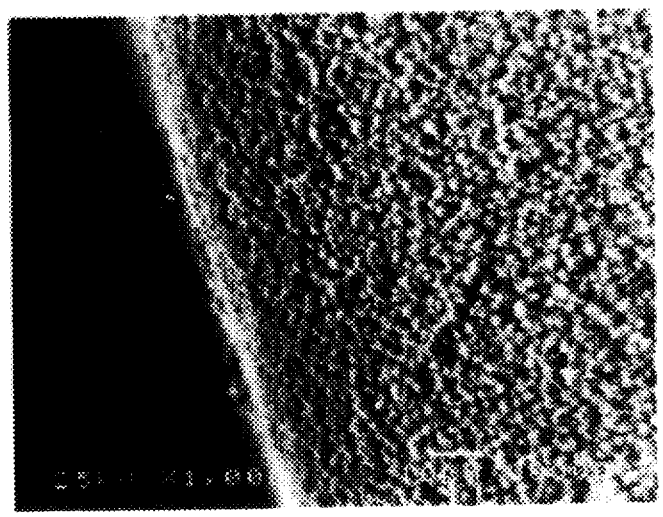
FIG. 2 is an α-Al$_2$O$_3$ layer according to U.S. Ser. No. 08/348,084.

Surprisingly, a CVD method has been found to grow α-Al$_2$O$_3$ layers with a desired microstructure and surface topography. Furthermore, such α-Al$_2$O$_3$ layers have a surprisingly smooth surface morphology very suitable for the application of thin (0.1–1 μm) top coatings of TiC$_x$N$_y$O$_z$, in particular, a TiN layer, in order to make "edge identification" easier.

The method employed is based on the principle of first carefully controlling the nucleation step in order to grow the α-Al$_2$O$_3$ phase and then to alter the growth conditions a number of times, for instance, 3 to 10 times, during the entire Al$_2$O$_3$ deposition step in order to obtain the desired coating morphology. It has been found that the two dopants, H$_2$S and SF$_6$, give different α-Al$_2$O$_3$ growth conditions and by employing this fact and changing the growth condition after a certain scheme, it is possible to grow the desired α-Al$_2$O$_3$ layers.

According to the presently claimed invention, an α-Al$_2$O$_3$ layer, 2.5–12 μm thickness, preferably 3–8 μm thickness, with an average grain size of 1–3 μm and an average surface smoothness of R$_{max}$≦0.4 μm over a length of 10 μm is provided which layer has by a naked eye observation, a shininess similar to a polished, brushed or wet-blasted Al$_2$O$_3$ layer. However, the layer according to the presently claimed invention can easily be distinguished from a mechanically treated layer by SEM studies at magnification of about 3000×. In the mechanically treated layer, the grains are deformed. In the layer of the presently claimed invention, the grains are not deformed and are parallel or essentially parallel to the top surface.

The body of the presently claimed invention comprises a substrate of a sintered cemented carbide, cermet or a ceramic body preferably of at least one metal carbide in a metal binder phase. The individual layers in the layer structure may be TiC or related carbide, nitride, carbonitride, oxycarbide and oxycarbonitride of a metal selected from the group consisting of metals in the Groups IVB, VB and VIB of the Periodic Table, B, Al and Si and/or mixtures thereof. At least one of said layers is in contact with the substrate. The outermost layer or the second outermost layer in the coating (in case of a thin top layer, see below) structure comprises

4 a dense, single phase texture α-Al$_2$O$_3$ layer with a smooth shiny surface. Preferably, said Al$_2$O$_3$ layer is in contact with a TiC$_x$N$_y$O$_z$ layer which preferably is the innermost layer of the coating. The coated bodies are preferably used as a metal cutting tools, most preferably for use in near net shape machining.

A thin, up to 1 μm thick, TiN layer on top of the Al$_2$O$_3$ layer gives the tool a shiny goldish appearance which makes the so-called "used edge identification" easier.

The improved cutting performance of such coated tool compared to a prior art tool is demonstrated in Example 3.

In addition to the smooth shiny surface of the Al$_2$O$_3$ layer according to the presently claimed invention, the Al$_2$O$_3$ layer is also characterized by its preferred crystal growth orientation in the (110) direction.

The Al$_2$O$_3$ layer disclosed in U.S. Ser. No. 08/348,084 is also textured in the 110-direction. However, that layer does not exhibit the favorable smooth, shiny surface and grain shape as the Al$_2$O$_3$ layer according to the presently claimed invention.

The texture is determined by X-Ray Diffraction (XRD) measurements. A Texture Coefficient, TC, is defined as:

$$TC(hkl) = \frac{I(hkl)}{I_o(hkl)} \left\{ \frac{1}{n} \Sigma \frac{I(hkl)}{I_o(hkl)} \right\}^{-1}$$

where
I(hkl)=measured intensity of the (hkl) reflection
I$_o$(hkl)=standard intensity of the ASTM standard powder pattern diffraction data
n=number of reflections used in the calculation (hld), reflections used are: (012), (104), (110), (113), (024), (116).

According to the presently claimed invention, TC for the set of (110) crystal planes is larger than 1.5, preferably larger than 2.5.

The smooth, shiny and 110-textured α-Al$_2$O$_3$ layer according to the presently claimed invention is obtained by careful control of the oxidation potential of the CVD-reactor atmosphere prior to the nucleation of Al$_2$O$_3$. The total concentration level of H$_2$O or other oxidizing species should preferably be below 5 ppm. However, the nucleation of Al$_2$O$_3$ is initiated by a controlled sequencing of the reactant gases as follows: CO$_2$, CO and AlCl$_3$ in a H$_2$ atmosphere. The temperature shall preferably be about 1000° C., generally between 970° to 1030° C., during the nucleation.

According to the presently claimed invention, during the Al$_2$O$_3$ growth process two different dopants are employed, one sulphur-based dopant containing no fluorine, preferably H$_2$S in a concentration 0.1–1% by volume of the total atmosphere, while the other is a sulphur-fluorine-based dopant, preferably SF$_6$ 0.1–1%.

In one embodiment, the change in growth conditions is obtained by switching between the two dopants a number of times during the Al$_2$O$_3$ process, e.g., at least every hour, preferably in shorter periods, e.g., every 20 minutes.

In an alternative embodiment, mixtures of two types of dopants mentioned above are used. As an example, a concentration of 0.1% H$_2$S is kept throughout the entire Al$_2$O$_3$ process while SF$_6$ is introduced in intervals of 10 min to 1.5 h with a concentration of 0.3–1% by volume of the total atmosphere.

HCl can optionally be added to the process gas mixture (see patent examples) in order to control the growth rate. Different grain size and grain shape can be obtained by using different dopant concentrations and different intervals of treatment in accordance with the present invention and using the skill of the artisan.

It is surprising how grain shape, grain size and crystallographic texture can be changed and controlled by employing the two types of dopants mentioned above.

Other growth conditions can be used provided that they provide sufficient change in growth conditions. The exact process conditions, however, depend to a certain extent on the design of the equipment used. It is within the purview of the skilled artisan to determine whether the desired coating morphology has been obtained and to modify the nucleation and the deposition conditions in accordance the present specification, if desired, to effect the surface appearance and smoothness of the layer.

Inserts coated according to the presently claimed invention can be used for all kinds of machining. However, they are particularly useful for near net shape machining where clean cutting edges are required.

The invention is additionally illustrated in connection with the following Examples which are to be considered as illustrative of the present invention. It should be understood, however, that the invention is not limited to the specific details of the Examples.

EXAMPLE 1

A) Cemented carbide cutting inserts with the composition 6.5% Co, 8.5% cubic carbides and balance WC were coated with a 6 μm thick layer of TiCN. In subsequent process steps during the same coating cycle, a 5 μm thick layer of α-$Al_2O_3$ was deposited. Prior to the nucleation, the oxidation potential of the hydrogen carrier gas, i.e., the water vapor concentration, was explicitly set forth to a low level, less than 5 ppm. A reaction gas mixture comprising $CO_2$, CO and $AlCl_3$ was sequentially added to the hydrogen carrier gas in given order.

The gas mixtures and other process conditions during the $Al_2O_3$ deposition steps 1–5 comprised:

| Step | 1 | 2 | 3 | 4 | 5 |
| --- | --- | --- | --- | --- | --- |
| $CO_2$ | 4% | 4% | 4% | 4% | 4% |
| $AlCl_3$ | 4% | 4% | 4% | 4% | 4% |
| CO | 2% | — | — | — | — |
| $SF_6$ | — | 0.3% | — | 0.3% | — |
| $H_2S$ | — | — | 0.3% | — | 0.3% |
| HCl | 1.5% | 4% | 4% | 4% | 4% |
| $H_2$ | balance | balance | balance | balance | balance |
| Pressure | 60 mbar | 60 mbar | 60 mbar | 60 mbar | 60 mbar |
| Temperature | 1000° C. | 1030° C. | 1030° C. | 1030° C. | 1030° C. |
| Duration | 1 h | 1.5 h | 1.5 h | 1.5 h | 1.5 h |

The resulting $Al_2O_3$ layer appeared very smooth and shiny. A cooling crack network could be observed in SEM. XRD analysis showed a texture coefficient, TC(110), of 1.8 of the (110) planes in the single α-phase of the $Al_2O_3$ layer.

B) The cemented carbide substrate of A) was coated with TiCN (6 μm) and $Al_2O_3$ (5 μm) as set forth in A) except for that the $Al_2O_3$ process was carried out according to prior art technique resulting in a mixture of coarse α- and fine κ-$Al_2O_3$ grains in the layer.

C) The cemented carbide substrate of A) was coated with TiCN (6 μm) and $Al_2O_3$ (5 μm) as set forth in A) except for that the $Al_2O_3$ process was carried out according to U.S. Ser. No. 08/348,084 resulting in an α-$Al_2O_3$ layer with elongated $Al_2O_3$ grains and with a texture coefficient of 3.2.

The cutting inserts from A), B) and C) were tested with respect to edge line flaking in a facing operation in an alloyed steel (AISI 1518, W-no. 1.0580). The shape of the machined work piece was such that the cutting edge was intermitted three times during each revolution.

Cutting data:

Speed=130–220 m/min

Cutting Depth=2 mm and

Feed=0.2 mm/rev

The inserts were run one cut over the face of the work piece.

The result below is expressed as percentage of the edge line in cut that obtained flaking.

| | Flaking (%) Edge Line | Cleanness of Edge |
| --- | --- | --- |
| A) single phase/ textured α-$Al_2O_3$ according to the invention | 10 | Almost no smearings |
| B) α + κ $Al_2O_3$ | 72 | Smearings |
| C) 110-textured according to U.S. serial no. 08/348,084 | 43 | Some smearings |

EXAMPLE 2

D) Cemented carbide cutting inserts with the composition 6.5% Co, 8.5% cubic carbides and balance WC were coated with a 7 μm thick layer of TiC. In subsequent process steps during the same coating cycle, a 6 μm thick layer of α-$Al_2O_3$ was deposited. Prior to the nucleation, the oxidation potential of the hydrogen carrier gas, i.e., the water vapor concentration, was explicitly set forth to a low level, less than 5 ppm.

A reaction gas mixture comprising $CO_2$, CO and $AlCl_3$ was sequentially added to the hydrogen carrier gas in given order.

The gas mixtures and other process conditions during the $Al_2O_3$ deposition steps comprised:

| Step | 1 | 2 | 3 |
| --- | --- | --- | --- |
| $CO_2$ | 4% | 4% | 4% |
| $AlCl_3$ | 4% | 4% | 4% |
| CO | 2% | — | — |
| $SF_6$ | — | 0.4% | — |
| $H_2S$ | — | — | 0.4% |
| HCl | 1.5% | 4% | 4% |
| $H_2$ | balance | balance | balance |
| Pressure | 60 mbar | 60 mbar | 60 mbar |
| Temperature | 1000° C. | 1030° C. | 1030° C. |
| Duration | 1 h | 20 min | 20 min |

Steps 2 and 3 were repeated 8 times.

The resulting $Al_2O_3$ layer appeared very smooth and shiny. XRD analysis showed a texture coefficient, TC(110), of 2.9 of the (110) planes in the single α-phase of the $Al_2O_3$ layer.

E) The cemented carbide substrate of D) was coated with TiC (7 μm) and $Al_2O_3$ (6 μm) as set forth in D) except for that the $Al_2O_3$ process was carried out according to U.S. Ser. No. 08/348,084, resulting in a fine-grained α-$Al_2O_3$ layer with a 012-texture and with a texture coefficient of 2.1.

The cutting inserts from D) and E) were tested with respect to edge line flaking as described above in Example 1 with the following results:

| | Flaking (%) Edge Line | Cleanness of Edge |
| --- | --- | --- |
| D) single phase/ textured α-$Al_2O_3$ | 5 | Clean Edge |

|  | Flaking (%) Edge Line | Cleanness of Edge |
|---|---|---|
| according to the invention | | |
| E) 012-textured according to U.S. serial no. 08/348,084 | 54 | Smearings |
| G) 012-textured according to U.S. serial no. 08/348,084 + TiN top layer | 68 | Smearings |

EXAMPLE 3

F) Cemented carbide cutting inserts with the composition 6.5% Co, 8.5% cubic carbides and balance WC were coated with a 5 μm thick layer of TiCN. In subsequent process steps during the same coating cycle, a 5 μm thick layer of α-$Al_2O_3$ was deposited. Prior to the nucleation, the oxidation potential of the hydrogen carrier gas, i.e., the water vapor concentration, was explicitly set forth to a low level, less than 5 ppm. A reaction gas mixture comprising $CO_2$, CO and $AlCl_3$ was sequentially added to the hydrogen carrier gas in given order.

The gas mixtures and other process conditions during the $Al_2O_3$ deposition steps as according to A) in Example 1.

On top of the $Al_2O_3$ layer, a 0.2 μm TiN layer was deposited according to prior art technique.

The resulting coated insert appeared very smooth, shiny and with a goldish color. XRD analysis showed a texture coefficient, TC(110), of 2.3 of the (110) planes in the single α phase of the $Al_2O_3$ layer.

G) The cemented carbide substrate of F) was coated with TiCN (5 μm) and $Al_2O_3$ (5 μm) as set forth in F) except that the $Al_2O_3$ process was carried out according to U.S. Ser. No. 08/348,084. On top, a 0.2 μm TiN layer was deposited under the same process conditions as in F). The resulting coated insert showed a dull yellow color. XRD analysis showed a texture coefficient, T(012), of 2.2.

The cutting inserts from F) and G) were tested with respect to edge line flaking as has been described above in Example 1 with the following results:

|  | Flaking (%) Edge Line | Cleanness of Edge |
|---|---|---|
| F) single phase/ textured α-$Al_2O_3$ according to the invention + TiN top layer | 22 | Very Little Smearing |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A body with a <20 μm thick coating including an outermost layer or second outermost layer of α-$Al_2O_3$ with a thickness of 2.5–12 μm wherein said $Al_2O_3$ layer as coated and in the absence of post coating treatments, has a smooth, shiny appearance like it has been polished.

2. The body of claim 1 wherein said $Al_2O_3$ layer has a 110-texture with a texture coefficient larger than 1.5, the texture coefficient being defined as:

$$TC(hkl) = \frac{I(hkl)}{I_o(hkl)} \left\{ \frac{1}{n} \Sigma \frac{I(hkl)}{I_o(hkl)} \right\}^{-1}$$

where
I(hkl)=measured intensity of the (hkl) reflection
$I_o$(hkl)=standard intensity of the ASTM standard powder pattern diffraction data
n=number of reflections used in the calculation (hkl), reflections used are: (012), (104), (110), (113), (024), (116).

3. The body of claim 1 wherein said $Al_2O_3$ layer has an average surface smoothness of $R_{max} \leq 0.4$ μm over a length of 10 μm.

4. The body of claim 1 wherein the body is a substrate of a cemented carbide, cermet or a ceramic.

5. The body of claim 1 wherein said coating comprises layers of said $Al_2O_3$ layer and a $TiC_xN_yO_z$ layer.

6. The body of claim 5 wherein said $Al_2O_3$ layer is atop said $TiC_xN_yO_z$ layer.

7. The body of claim 6 wherein on top of said $Al_2O_3$ layer is a thin, up to 1 μm thick, layer of TiN.

8. The body of claim 1 wherein the outermost layer of α-$Al_2O_3$ has a thickness of 3–8 μm.

9. The body of claim 2 wherein the texture coefficient is larger than 2.5.

10. The body of claim 4 wherein said the cermet of said body is a titanium-based carbonitride.

* * * * *